United States Patent [19]

Kemner et al.

[11] Patent Number: 4,712,069
[45] Date of Patent: Dec. 8, 1987

[54] MAGNETIC RESONANCE IMAGING APPARATUS INCLUDING TWO ORTHOGONAL R.F. COILS

[75] Inventors: Rudolf Kemner; Hilco T. Kalmijn, both of Eindhoven, Netherlands

[73] Assignee: U.S. Philips Corporation, New York, N.Y.

[21] Appl. No.: 841,132

[22] Filed: Mar. 18, 1986

[30] Foreign Application Priority Data

Mar. 22, 1985 [NL] Netherlands ..................... 8500844

[51] Int. Cl.[4] ........................................... G01R 33/20
[52] U.S. Cl. ................................... 324/322; 324/318
[58] Field of Search ............... 324/300, 307, 318, 322, 324/309; 333/35

[56] References Cited

FOREIGN PATENT DOCUMENTS 2161940 1/1986 United Kingdom ................. 324/318

OTHER PUBLICATIONS

Single Coil Probe with Transmission-line Tuning for NMR by V. R. Cross et al., Rev. Sci. Instrum., vol. 47, No. 12, Dec. 1976.

*Primary Examiner*—Stewart J. Levy
*Assistant Examiner*—Louis M. Arana
*Attorney, Agent, or Firm*—Robert T. Mayer; Algy Tamoshunas

[57] ABSTRACT

In an apparatus for performing magnetic resonance measurements by means of an orthogonal system of excitation detection coils there is provided a switching circuit for powering and reading the coil system which includes a $\frac{1}{4}$ λ coaxial conductor as a connection between the two coil assemblies and a $\frac{1}{4}$ λ coaxial conductor with a 90° phase delay as a connection between the first $\frac{1}{4}$ λ conductor and the second coil assembly and a detection device. By suitable tuning of the relevant circuit components and the coils, preferably based on 50 Ohms, a simple switching circuit with appropriate matching and phase correction is thus achieved. Specifically, the r.f. power source can be connected to the circuit via an n λ conductor. In the open condition during detection, the n λ conductor represents an infinite impedance for the switching circuit.

7 Claims, 2 Drawing Figures

MAGNETIC RESONANCE IMAGING APPARATUS INCLUDING TWO ORTHOGONAL R.F. COILS

The invention relates to a magnetic resonance imaging apparatus which includes a system of magnets for generating a static main magnetic field, an r.f. coil system which includes two mutually orthogonal coils for excitation and/or detection of magnetic resonance signals, a switching circuit which includes the coil system for the excitation and/or reading of the coil system, and also an r.f. power supply source.

An apparatus of this kind is described in the article "Quadrature Detection in the Laboratory Frame" by D. I. Hoult et al, published in Magnetic Resonance in Medicine I, 1984, pages 339–353.

The assembly of quadrature coils in a magnetic resonance imaging apparatus described in the Hoult article offers the advantages of a better signal-to-noise ratio, reduced disturbances due to eddy currents, and lower power supply requirements. However, when quadrature coils are used for magnetic resonance measurements, a very disturbing phase shift occurs between the excitation and the detection. Even partial compensation already necessitates a very complex control circuit, which affects the reliability and simplicity of the apparatus.

It is the object of the invention to mitigate this drawback. To achieve this, a magnetic resonance imaging apparatus of the kind set forth is characterized in that for impedance matching and phase correction during excitation and detection, the switching circuit includes a first $\frac{1}{4}\lambda$ conductor which interconnects a first and a second coil, and also includes a second $\frac{1}{4}\lambda$ conductor which connects the second coil to an output amplifier.

In an apparatus in accordance with the invention the second $\frac{1}{4}\lambda$ conductor forms an infinite impedance upon excitation. The two coils are thus adapted to the same impedance and the first $\frac{1}{4}\lambda$ conductor provides the desired 90° delay. The impedance thereof is adapted to the impedance of the second coil assembly so that the two impedances together provide correct matching to the impedance of the power supply source. During detection the power supply source is uncoupled and the $\frac{1}{4}\lambda$ conductors and further circuit elements match the impedance to the detection system, a 90° phase shift occurring at the same time.

The switching device in a preferred embodiment includes an $n\lambda$ conductor which can be coupled to the power supply. Upon excitation, the second conductor, which is short-circuited to the detection device, represents an infinite impedance. Upon detection, the $n\lambda$ conductor is uncoupled from the power supply source and the impedance of the first coil assembly is infinite. The first coil assembly is then connected in parallel to the second coil assembly by the first $\frac{1}{4}\lambda$ conductor, so that correct matching, in this case to the signal amplifier, is again obtained. This circuit each time ensures matching of the impedance to the power supply source or the signal amplifier with the appropriate delay.

The impedances of the $n\lambda$ conductor and the second $\frac{1}{4}\lambda$ conductor in a preferred embodiment equal 50 Ohms, so that for a circuit impedance of 100 Ohms for each of the coil assemblies, the impedance of the first $\frac{1}{4}\lambda$ conductor equals 100 Ohms. 50-Ohm matching to customary signal amplifiers is thus obtained.

Each of the coil assemblies in a further embodiment includes a capacitance for pseudo-symmetrical excitation, so that the excitation can be realized in a simple, interference-free manner.

The second $\frac{1}{4}\lambda$ conductor may be connected to the signal amplifier by, for example a diode circuit which realizes automatic matching for excitation and detection.

Some preferred embodiments in accordance with the invention will be described in detail hereinafter with reference to the drawing, wherein.

Figure 1:
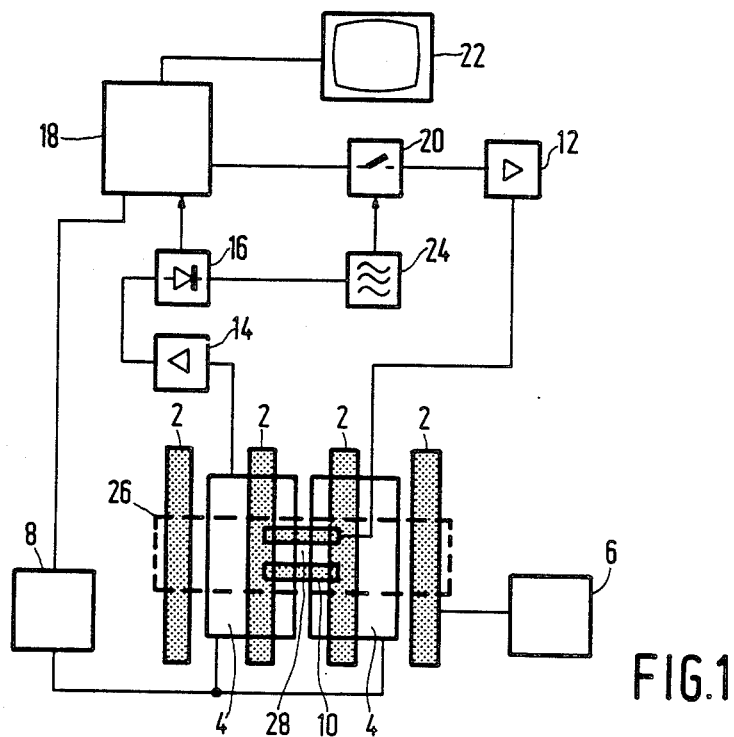
FIG. 1 shows a block diagram of a magnetic resonance imaging apparatus.

A magnetic resonance imaging apparatus shown in FIG. 1 includes magnet coils 2 for generating a static magnetic field, magnet coils 4 for generating a quasi-static gradient field, a power supply source 6 for the magnet coils 2 and a power supply source 8 for the magnet coils 4. A coil system 10 serves for generating an r.f. pulsed magnetic field and is connected to an r.f. source 12. In this embodiment the coil system is also used for detection of nuclear spin resonance generated by the r.f. field in an object to be measured. During detection, the coil system 10 is connected to a detection amplifier 14. The amplifier 14 of the present embodiment is connected to a rectifier 16 which is connected to a central control device 18. The central control device 18 also controls a modulator 20 for the r.f. 12, the power supply source 8 for the quasi-static gradient field, and a monitor 22 for display. An r.f. oscillator 24 controls the modulator 20 for the r.f. source 12, as well as the phase-sensitive rectifier 16 which processes the measurement signals. A Faraday cage 26 encloses a measurement space 28 within the apparatus.

Figure 2:
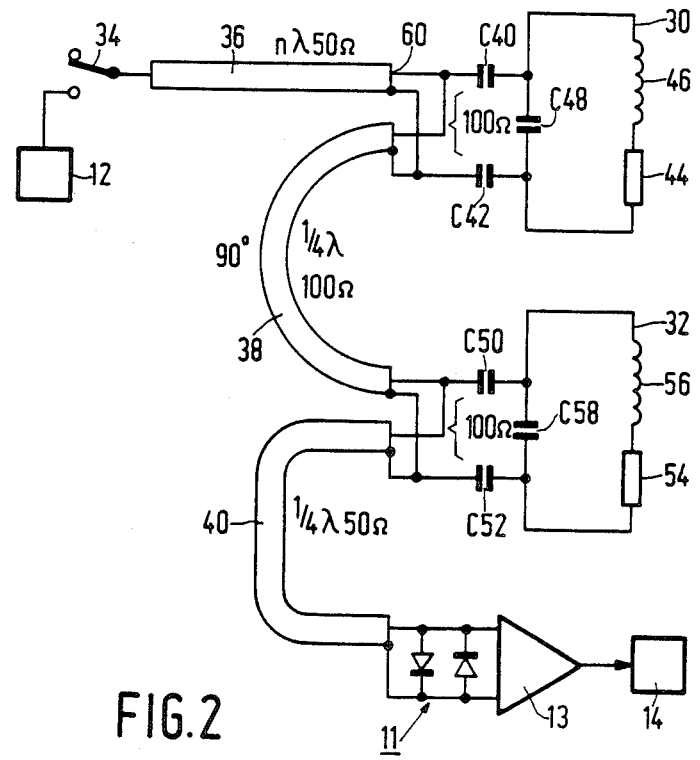
FIG. 2 shows a circuit diagram including an appropriate r.f. coil system.

The circuit diagram of FIG. 2 shows a first coil assembly 30 and a second coil assembly 32. These coil assemblies are orthogonally arranged in the measurement space 28 and form the coil system 10 shown in FIG. 1. The circuit diagram also shows the r.f. power supply 12 and the detector device 14 of FIG. 1. For excitation, the r.f. source 12 is connected by switch 34 and an $n\lambda$ conductor 36, to the first coil assembly 30 and, by a first $\frac{1}{4}\lambda$ conductor 38, to the second coil assembly 32. Coil assembly 32 is connected to the detector device 14 via a second $\frac{1}{4}\lambda$ conductor 40, a diode circuit 11 and a preamplifier 13.

The $n\lambda$ conductor 36 and the first $\frac{1}{4}\lambda$ conductor 38 are in this case connected via a first matching capacitor C 40 and a first capacitor C 42 for pseudo-symmetrical excitation of the coil assembly as described in Netherlands Patent Application NL 8402380 which corresponds to U.S. application Ser. No. 752,281, and also via a first tuning capacitor C 48 which is included, together with an impedance 44, in a loop for the inductance 46. Similarly, the first $\frac{1}{4}\lambda$ conductor 38 and the second $\frac{1}{4}\lambda$ conductor 40 are connected, via a second matching capacitor C 50 and a second capacitor C 52 for pseudo-symmetrical excitation of the second coil assembly 32 and via a tuning capacitor C 58 which is included in a loop for an inductance 56 together with an impedance 54.

Upon excitation of the coil system, the switch 34 is closed and the diode circuit 11 forms a short-circuit for the comparatively strong transmission pulses. The second $\frac{1}{4}\lambda$ conductor 40 thus forms an infinite impedance. When both coil assemblies are matched to, for example 100 Ohms, the first $\frac{1}{4}\lambda$ conductor 38 forms a 90° delay line and a 100-Ohm characteristic impedance thereof constitutes appropriate matching to the 100-Ohm impedance of the second coil assembly 32. Two 100-Ohm impedances then occur in parallel on an output 60 of the nλ conductor and appropriate 50-Ohm impedance matching to the supply source 12 which is also tuned to an impedance of 50 Ohms is achieved.

The switch 34 is opened upon detection. This switch can be simply switched in a customary, automatic manner. Due to the nλ conductor 36, the impedance vis-à-vis the power supply is now infinite. The first coil assembly which is still matched to 100 Ohms is then connected, via the 100-Ohm ¼λ conductor 40 forming a 90° delay line and parallel to the second coil assembly matched to 100 Ohms, to the diode circuit 11 which is open for the small signals then occurring.

The two 100-Ohm parallel-connected elements, that is to say the second ¼λ conductor 40 and the second coil assembly 32, together represent appropriate matching to the 50-Ohm input impedance of the preamplifier 11 of the detector device 14. Using extremely simple means, this circuit realizes optimum matching from the point of view of the impedance as well as from the point of view of the desired delay lines. The 50-Ohm impedance stated above has been chosen rather arbitrarily, but represents a very practical value because many electronic components are designed for such a value. If desired, other impedances can also be used as long as the correct ratios are maintained.

What is claimed is:

1. A magnetic resonance imaging apparatus comprising a system of magnets for generating a static main magnetic field, an r.f. coil system which includes two mutually orthogonal coils for excitation and detection of magnetic resonance signals, a source of r.f. power, means for detecting the resonance signals and connecting means for connecting the r.f. coil system to the r.f. power source and to the detecting means, said connecting means including a first ¼λ conductor which interconnects the two orthogonal coils and a second ¼λ conductor which connects one of the two orthogonal coils to said detecting means.

2. A magnetic resonance imaging apparatus as claimed in claim 1 wherein said connecting means includes a nλ conductor connected to the r.f. power source.

3. A magnetic resonance imaging apparatus as claimed in claim 2 wherein said n λ conductor is connected to the r.f. power source through a switch.

4. A magnetic resonance imaging apparatus as claimed in claim 2 wherein the n λ conductor and the second ¼λ conductor have the same impedance which equals half the impedance of the first ¼λ conductor, the impedance of the first ¼λ conductor being equal to the tuning impedance of each of the mutually orthogonal coils.

5. A magnetic resonance imaging apparatus as claimed in claim 4, wherein the tuning impedance of the mutually orthogonal coils equals 100 Ohms.

6. A magnetic resonance imaging apparatus as claimed in claim 1, 2, 4 or 5, including a tuning capacitor, a matching capacitor, and a capacitor for pseudo-symmetrical excitation of each of the two orthogonal coils.

7. A magnetic resonance imaging apparatus as claimed in claim 1, 2, 4 or 5 wherein said detecting means includes an output signal amplifier and wherein the second ¼λ conductor is connected to the output signal amplifier by a circuit having two oppositely connected diodes which form a short-circuit during excitation.

* * * * *